United States Patent
Seo et al.

(10) Patent No.: US 9,129,903 B2
(45) Date of Patent: Sep. 8, 2015

(54) METHODS OF FABRICATING A SEMICONDUCTOR DEVICE USING VOIDS IN A SACRIFICIAL LAYER

(71) Applicant: Samsung Electronics Co., Ltd., Suwon-si, Gyeonggi-do (KR)

(72) Inventors: JungWoo Seo, Gyeonggi-do (KR); JinSeo Choi, Gyeonggi-do (KR); KyoungRyul Yoon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/325,080

(22) Filed: Jul. 7, 2014

(65) Prior Publication Data

US 2014/0322916 A1    Oct. 30, 2014

Related U.S. Application Data

(62) Division of application No. 13/772,712, filed on Feb. 21, 2013, now Pat. No. 8,802,551.

(51) Int. Cl.
*H01L 21/308* (2006.01)
*H01L 21/768* (2006.01)
*H01L 21/033* (2006.01)
*H01L 21/311* (2006.01)

(52) U.S. Cl.
CPC .......... *H01L 21/308* (2013.01); *H01L 21/0337* (2013.01); *H01L 21/3086* (2013.01); *H01L 21/31144* (2013.01); *H01L 21/76816* (2013.01)

(58) Field of Classification Search
USPC .......................... 438/422, 597, 675, 702, 703
See application file for complete search history.

(56) References Cited

U.S. PATENT DOCUMENTS

| 7,579,233 | B2 | 8/2009 | Hwang |
| 7,659,208 | B2 | 2/2010 | Zhou et al. |
| 7,737,039 | B2 | 6/2010 | Sandhu et al. |
| 7,787,301 | B2 | 8/2010 | Lee et al. |
| 8,309,463 | B2 | 11/2012 | Lee |
| 2005/0179135 | A1 | 8/2005 | Kumar |
| 2007/0007656 | A1 | 1/2007 | Yoon |
| 2007/0166981 | A1 | 7/2007 | Furukawa et al. |
| 2008/0067550 | A1 | 3/2008 | Lee et al. |
| 2009/0115064 | A1 | 5/2009 | Sandhu et al. |
| 2009/0149026 | A1 | 6/2009 | Zhou et al. |
| 2009/0170034 | A1 | 7/2009 | Lim |
| 2010/0120258 | A1 | 5/2010 | Kim |

(Continued)

FOREIGN PATENT DOCUMENTS

| KR | 10-2008-0074529 A | 8/2008 |
| KR | 10-2009-0069091 A | 6/2009 |
| KR | 10-2009-0072669 A | 7/2009 |

*Primary Examiner* — Alexander Ghyka
(74) *Attorney, Agent, or Firm* — Myers Bigel Sibley & Sajovec, P.A.

(57) ABSTRACT

A semiconductor device is fabricated by forming first holes arranged along a first direction on an etch-target layer, forming dielectric patterns in the first holes, conformally forming a barrier layer on the dielectric patterns, forming a sacrificial layer on the barrier layer to define a first void, partially removing the sacrificial layer to expose the first void, anisotropically etching the barrier layer to form second holes below the first void, and etching portions of the etch-target layer located below the first and second holes to form contact holes. The first void may be formed on a first gap region confined by at least three of the dielectric patterns disposed adjacent to each other, and the sacrificial layer may include a material having a low conformality.

3 Claims, 33 Drawing Sheets

(56) References Cited

U.S. PATENT DOCUMENTS

| | | |
|---|---|---|
| 2011/0124196 A1 | 5/2011 | Lee |
| 2011/0294297 A1 | 12/2011 | Sukekawa |
| 2012/0153500 A1 | 6/2012 | Kim et al. |
| 2012/0187566 A1 | 7/2012 | Horak et al. |
| 2012/0270390 A1 | 10/2012 | Noguchi et al. |
| 2013/0084696 A1 | 4/2013 | Kim et al. |

METHODS OF FABRICATING A SEMICONDUCTOR DEVICE USING VOIDS IN A SACRIFICIAL LAYER

CROSS-REFERENCE TO RELATED APPLICATION

The present application is a divisional of U.S. patent application Ser. No. 13/772,712, filed Feb. 21, 2013, entitled Methods of Fabricating a Semiconductor Device Using Voids In a Sacrificial Layer, assigned to the assignee of the present application, the disclosure of which is hereby incorporated herein by reference in its entirety as if set forth fully herein.

BACKGROUND

Example embodiments of the inventive concepts relate to methods of fabricating a semiconductor device.

The degree of integration of semiconductor devices, such as semiconductor memory devices, continues to increase. Since the degree of integration of the semiconductor memory devices is an important factor determining cost of the semiconductor devices, semiconductor devices of high integration are desired. However, high cost equipment may be required for the formation of fine patterns in such semiconductor devices. Thus, there may be limitations in improving the process technology for forming the fine patterns due to the high cost equipment and/or difficulty of the process technology.

SUMMARY

Example embodiments of the inventive concepts provide a fabricating method capable of increasing an integration density of a semiconductor device.

According to example embodiments of the inventive concepts, a method of fabricating a semiconductor device may include forming first holes arranged along a first direction on an etch-target layer, forming dielectric patterns in the first holes, respectively, conformally forming a barrier layer on the dielectric patterns, forming a sacrificial layer on the barrier layer to define a first void, partially removing the sacrificial layer to expose the first void, anisotropically etching the barrier layer to form second holes below the first void, and etching portions of the etch-target layer located below the first and second holes to form contact holes. The first void may be formed on a first gap region confined by at least three of the dielectric patterns disposed adjacent to each other, and the sacrificial layer may include a material having a low conformality.

In example embodiments, the sacrificial layer may be formed to define a second void that may be formed on a second gap region confined by at least two of the dielectric patterns disposed adjacent to each other, and the first void may be formed to have a top located at a higher level than that of the second void.

In example embodiments, the first gap region may be wider than the second gap region.

In example embodiments, the partial removing of the sacrificial layer may be performed not to expose the second void.

In example embodiments, the method may further include forming a gap-filling layer to fill the first and second gap regions through the first void, after the partial removing of the sacrificial layer.

In example embodiments, the forming of the second holes may include performing an anisotropic etching process using the sacrificial layer as an etch mask to etch the gap-filling layer in the first gap region and retain the gap-filling layer in the second gap region.

In example embodiments, the gap-filling layer may include a material having an etch selectivity with respect to the barrier layer.

In example embodiments, the first holes may be arranged to form a zigzag arrangement.

In example embodiments, the second holes may be formed through the first gap region.

In example embodiments, the forming of the first holes may include forming an etch-stop layer and a mask layer on the etch-target layer, and anisotropically etching the mask layer.

In example embodiments, the forming of the dielectric patterns may include forming a dielectric to fill the first holes, performing a planarization process to form the dielectric patterns spaced apart from each other, and removing the mask layer.

In example embodiments, the method may further include forming a spacer on an inner sidewall of the first hole to reduce a width of the first hole.

In example embodiments, the sacrificial layer may be locally formed within a region provided with the dielectric patterns, and the method may further include forming an interlayer dielectric on an edge region of the dielectric patterns.

In example embodiments, the method may further include selectively removing the sacrificial layer, the barrier layer, the dielectric patterns, and the etch-stop layer, after the forming of the second holes.

In example embodiments, sizes and positions of the second holes may be determined by those of the first void.

In other example embodiments, a method of fabricating a semiconductor device may include forming a second layer on a first layer that is itself on a target layer, the second layer spanning a first hole in the first layer, the second layer including a tapered void therein that extends from the first hole and tapers to a tip in the second layer. The tip in the second layer is exposed. A hole is formed in the target layer using the tip in the second layer that was exposed.

According to other example embodiments, the second layer spans a first hole in the first layer and a second hole in the first layer that is spaced apart from the first hole, wherein the tapered void is a first tapered void and the tip is a first tip, the second layer further including a second tapered void therein that extends from the second hole and tapers to a second tip in the second layer. Moreover, the exposing the tip comprises exposing the first and second tips in the respective first and second tapered voids. Finally, the forming a hole comprises forming a hole using the first and second tips in the second layer that were exposed.

In other example embodiments, the second layer further spans a third hole in the first layer that is between the first and second holes, the second layer further including a third tapered void therein that extends from the third hole to a third tip in the second layer. The exposing the tip may comprise exposing the first and second tips in the second layer without exposing the third tip in the second layer.

In any of these embodiments, the first and second holes may be wider than the third hole. Moreover, in any of these embodiments, the second layer may comprise a conformal material having low conformality.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A through 11A are plan views illustrating a method of fabricating a semiconductor device according to example embodiments of the inventive concepts.

FIGS. 1B through 11B are sectional views taken along lines I-I' of FIGS. 1A through 11A, respectively.

FIGS. 1C through 11C are sectional views taken along lines II-II' of FIGS. 1A through 11A, respectively.

FIGS. 12A through 15A are plan views illustrating a method of fabricating a semiconductor device according to other example embodiments of the inventive concepts.

FIGS. 12B through 15B are sectional views taken along lines I-I' of FIGS. 12A through 15A.

FIGS. 12C through 15C are sectional views taken along lines II-II' of FIGS. 12A through 15A, respectively.

Figure 1A:
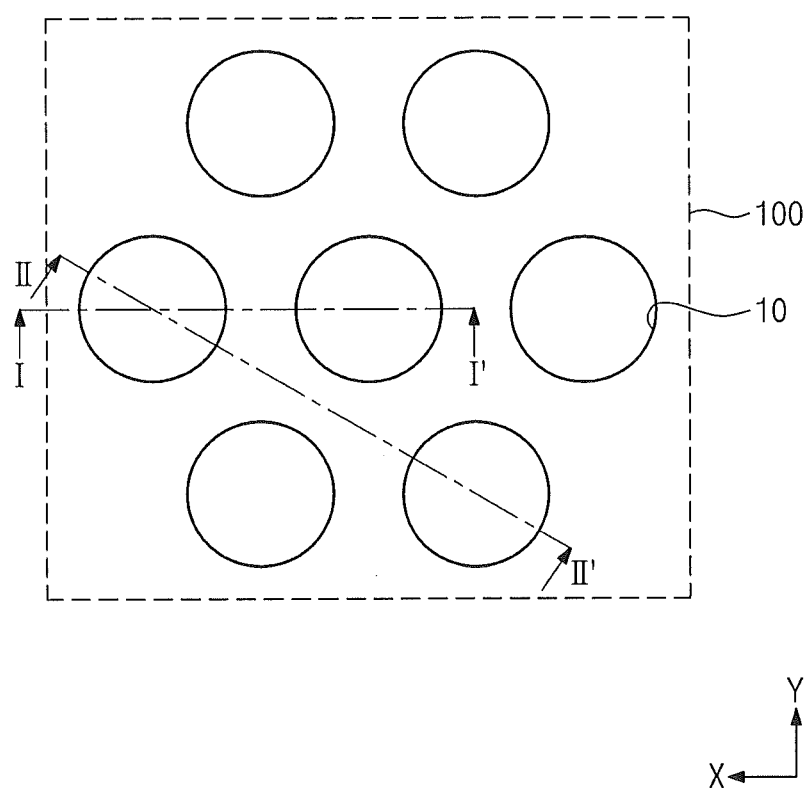

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements, layers, or process steps should be interpreted in a like fashion (e.g., "between" versus "directly between," "adjacent" versus "directly adjacent," "on" versus "directly on", "using" versus "directly using").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 11A are plan views illustrating a method of fabricating a semiconductor device according to example embodiments of the inventive concepts. FIGS. 1B through 11B are sectional views taken along lines I-I' of FIGS. 1A through 11A, respectively, and FIGS. 1C through 11C are sectional views taken along lines II-II' of FIGS. 1A through 11A, respectively.

Referring to FIG. 1A, first preliminary holes 10 may be formed on an etch-target layer 100. The etch-target layer 100 may be a semiconductor substrate (e.g., a silicon or germanium wafer), an oxide layer containing a semiconductor material thereon (e.g., a silicon oxide layer), and/or any other layer that is used in microelectronic device fabrication.

The first preliminary holes 10 may be arranged to form a plurality of rows. For example, each row of the first preliminary holes 10 may include at least two of the first preliminary holes 10 arranged parallel to a first direction (e.g., x-axis of FIG. 1A). In example embodiments, each row of the first preliminary holes 10 may be shifted along the first direction, by a distance less than a first directional pitch of the first preliminary holes 10, from other first preliminary hole 10 adjacent thereto. Accordingly, the first preliminary holes 10 constituting an adjacent pair of rows may be arranged to form a zigzag arrangement. For example, each of the first preliminary holes 10 constituting even-numbered rows may be formed between a corresponding pair of the first preliminary holes 10 constituting odd-numbered rows. Accordingly, some of the first preliminary holes 10, which are contained in different ones of the odd-numbered rows, may be arranged in a second direction (e.g., y-axis of FIG. 1A) to form a column, and some of the first preliminary holes 10, which are contained in different ones of the even-numbered rows, may be arranged in the second direction to form another column. In other embodiments, the first preliminary holes 10 may be regularly arranged in both of the first and second directions to form a lattice- or matrix-shaped arrangement, as will be described with reference to FIGS. 12A through 15A.

Figure 1B:
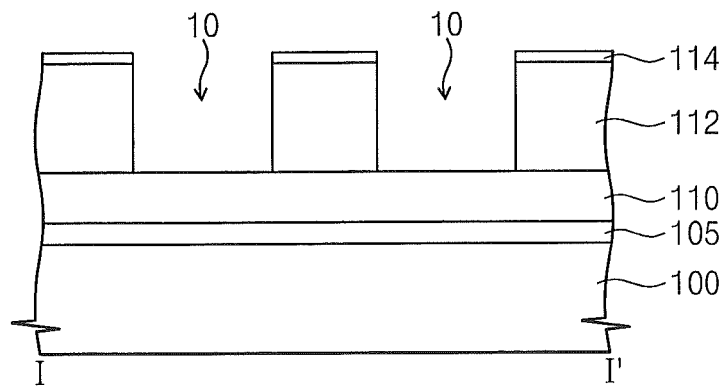
Figure 1C:
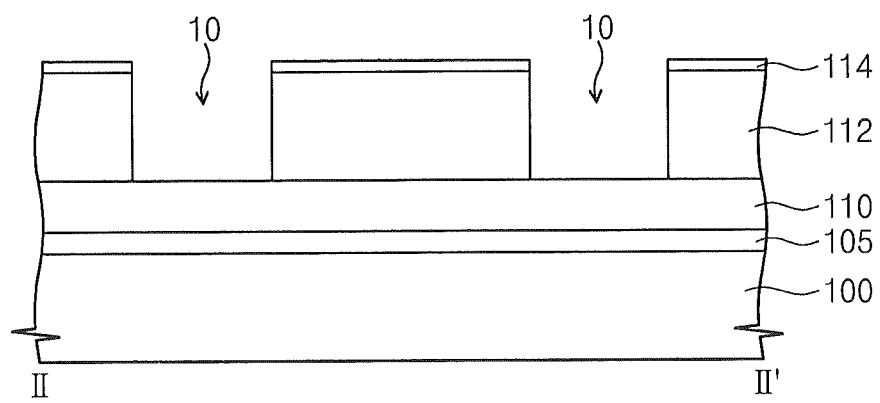

In example embodiments, as depicted in FIGS. 1B and 1C, the formation of the first preliminary holes 10 may include sequentially forming an etch-stop layer 105, a first mask layer 110, and a second mask layer 112 on the etch-target layer 100. Thereafter, the second mask layer 112 may be etched to form the first preliminary holes 10, for example, exposing the first mask layer 110. In example embodiments, the etch-stop layer 105 may include a silicon nitride layer (SiN), and the first mask layer 110 may include a semiconductor material (e.g., polysilicon). The second mask layer 112 may include a material having an etch selectivity with respect to the first mask layer 110. For example, the second mask layer 112 may be a spin-on hard (SOH) mask layer. In example embodiments, a silicon oxynitride layer 114 may be further formed on the second mask layer 112, before the etching step. In other embodiments, the formation of the silicon oxynitride layer 114 and/or the first mask layer 110 may be omitted.

Figure 2A:
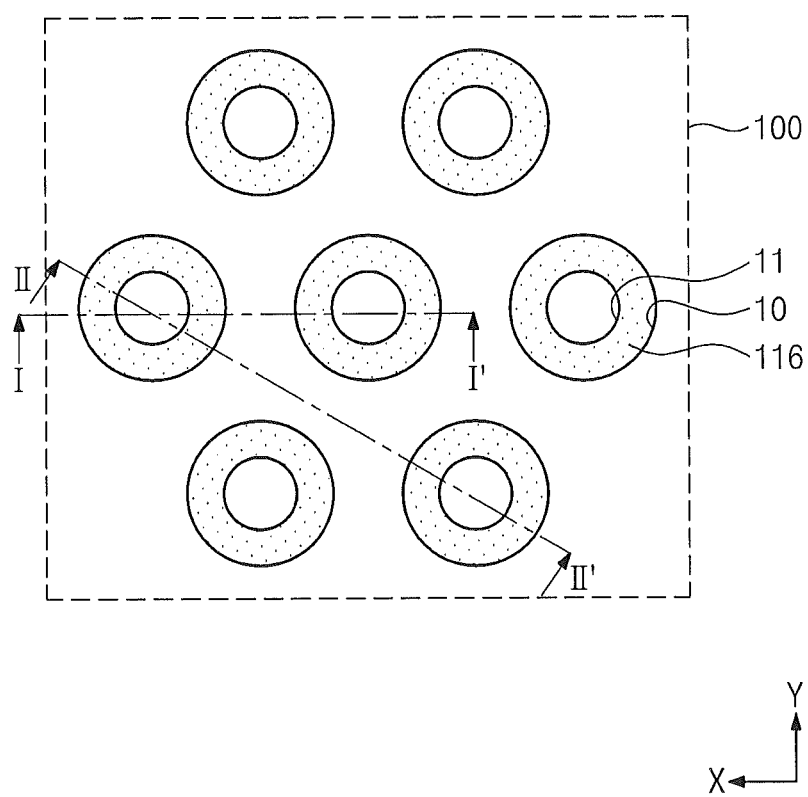
Figure 2B:
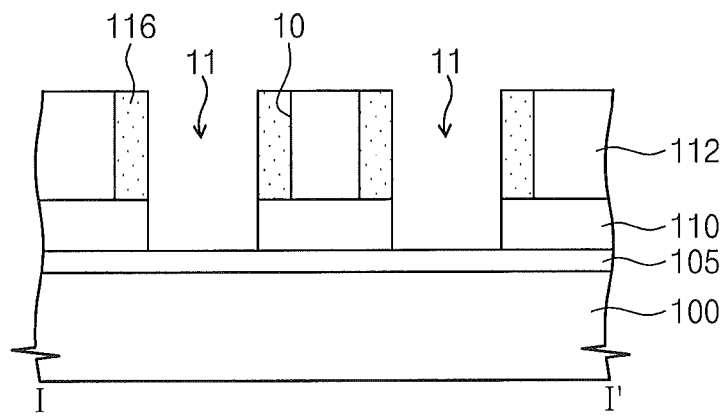
Figure 2C:
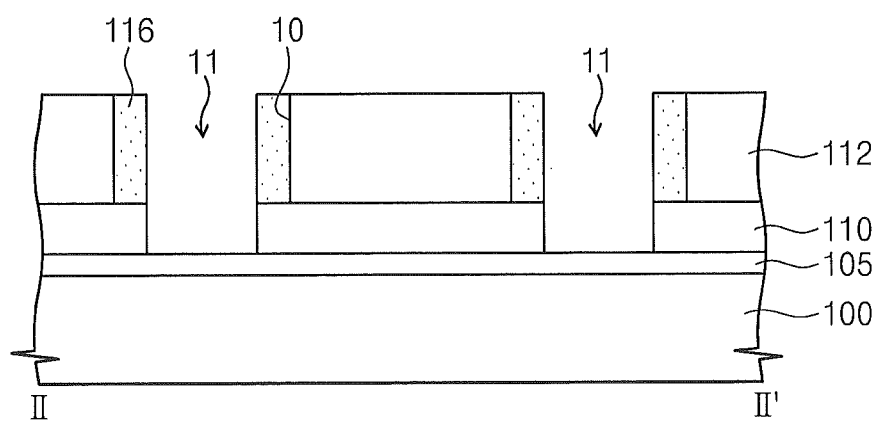

Referring to FIGS. 2A, 2B, and 2C, spacers 116 may be formed on sidewalls of the first preliminary holes 10. The spacers 116 may be formed by forming a spacer layer (not shown) to conformally cover the structure with the first preliminary holes 10, and then anisotropically etching the spacer layer. The spacers 116 may include a material having an etch selectivity with respect to the first and second mask layers 110 and 112. For example, the spacers 116 may include a silicon oxide layer. As a result, the spacers 116 may be locally formed on the sidewalls of the first preliminary holes 10. Due to the presence of the spacers 116, first holes 11, which will be formed in a subsequent process, can have a reduced width, compared with that of the first preliminary holes 10. In other words, a horizontal thickness of the spacer 116 may be controlled to adjust the width of the first holes 11.

Thereafter, the first mask layer 110 may be etched using the spacers 116 as an etch mask to form the first holes 11 exposing the etch-stop layer 105. In other example embodiments, the formation of the spacers 116 may be omitted, for example, when there is no need to adjust widths of the first holes 11.

Figure 3A:
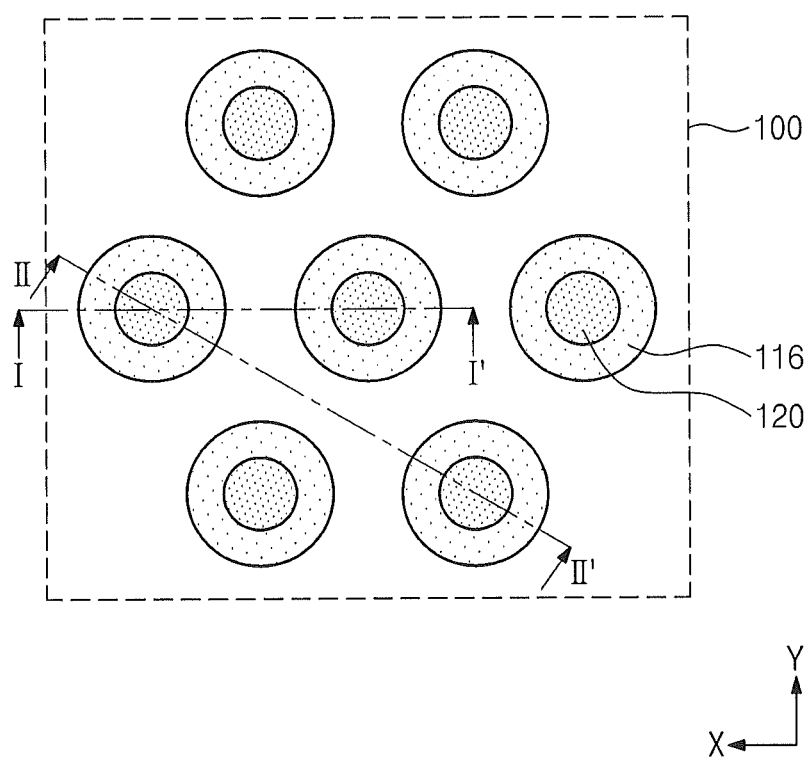
Figure 3B:
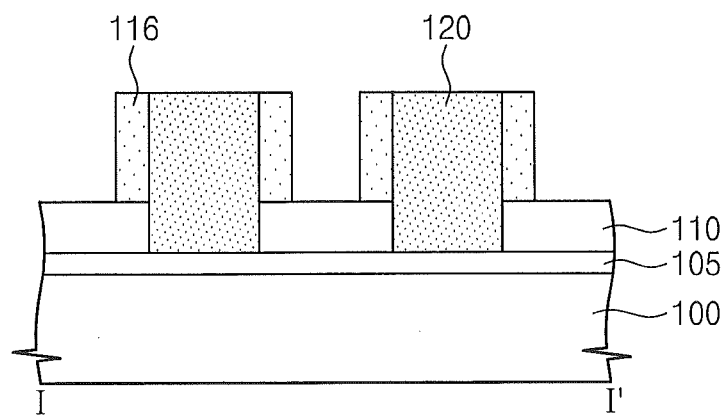
Figure 3C:
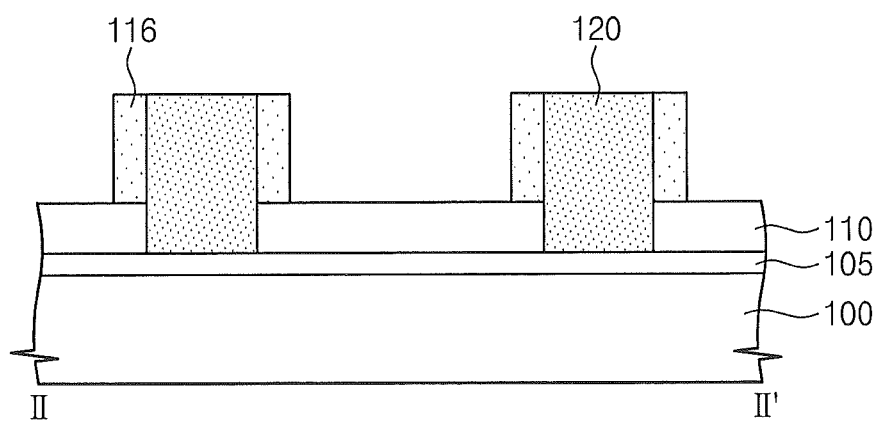

Referring to FIGS. 3A, 3B, and 3C, dielectric patterns 120 may be formed in, and in some embodiments to fill, the first holes 11. The formation of the dielectric patterns 120 may include depositing a dielectric layer to fill the first holes 11 and performing a planarization process. Thereafter, the second mask layer 112 may be removed. In the case where the spacer 116 has an etch selectivity with respect to the second mask layer 112, it may remain after the removal of the second mask layer 112. For example, the dielectric patterns 120 may have a structure protruding upward from the etch-target layer 100 and the spacer 116 may be provided on an outer sidewall of each dielectric pattern 120. The dielectric patterns 120 may include an oxide layer (e.g., a silicon oxide layer). In certain embodiments, the first mask layer 110 and the etch-stop layer 105 may not be removed, to serve as a protection layer protecting a top surface of the etch-target layer 100. Since the dielectric patterns 120 are formed in the first holes 11, respectively, the dielectric patterns 120 may be arranged to form the same arrangement as that of the first holes 11 (e.g., zigzag arrangement). It will also be understood that other techniques may be used to form a plurality of spaced apart dielectric patterns 120 without filling first holes 11 in a mask layer 112. For example, a blanket dielectric layer may be formed and then may be patterned to provide the plurality of spaced apart dielectric patterns 110.

Figure 4A:
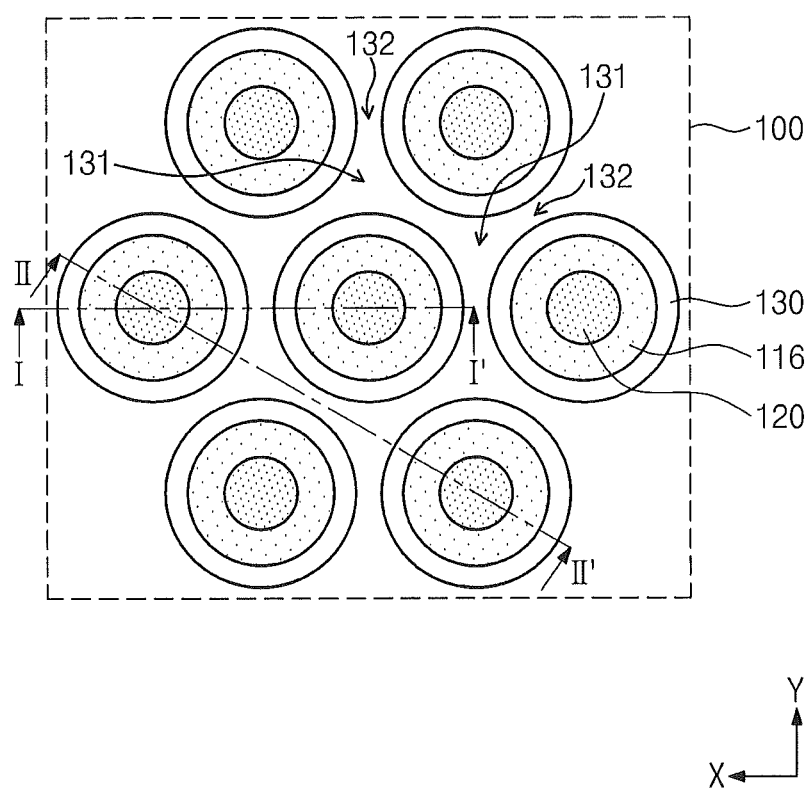
Figure 4B:
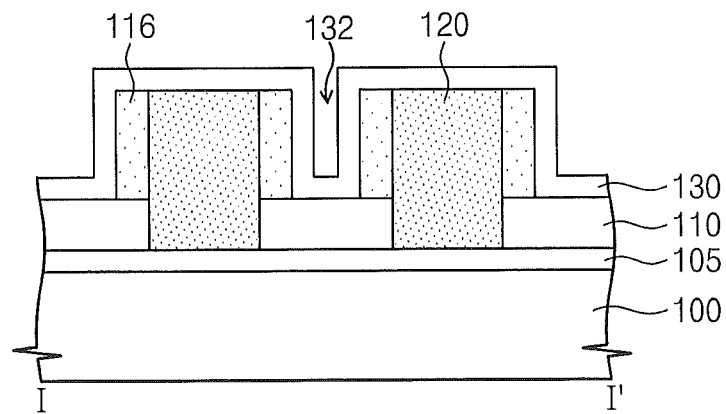
Figure 4C:
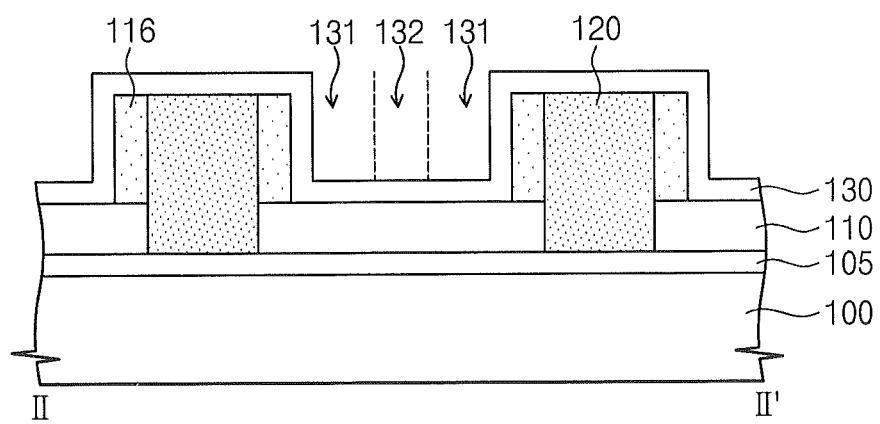

Referring to FIGS. 4A, 4B, and 4C, a barrier layer 130 may be formed on the first mask layer 110. The barrier layer 130 may be formed to conformally cover portions of the dielectric patterns 120 and the spacers 116 protruding upward from the first mask layer 100. For example, the barrier layer 130 may cover top surfaces of the dielectric patterns 120 and sidewalls of the spacers 116 with a uniform thickness. A thickness of the barrier layer 130 may be modified to adjust sizes of second holes to be formed in a subsequent process.

In example embodiments, the barrier layer 130 may be formed to conformally cover the structure protruding upward from the first mask layer 110 and define gap regions 131 and 132 between adjacent ones of the dielectric patterns 120. For example, the gap regions may include first gap regions 131, each of which is confined by adjacent three of the dielectric patterns 120 as shown in FIGS. 4A and 4C, and second gap regions 132, each of which is confined by adjacent two of the dielectric patterns 120 as shown in FIGS. 4A and 4B. The first gap region 131 may be wider than the second gap region 132. For example, the first gap region 131 confined by adjacent three of the dielectric patterns 120 may be wider than the second gap region 132 confined by adjacent two of the dielectric patterns 120, and the first gap region 131 may be used to define positions of the second holes to be formed in a subsequent process. The barrier layer 130 may include an oxide layer (e.g., a silicon oxide layer). In other example embodiments, a thickness of the barrier layer 130 may be selected in such a way that the second gap region 132 is not formed between adjacent two of the dielectric patterns 120.

Figure 5A:
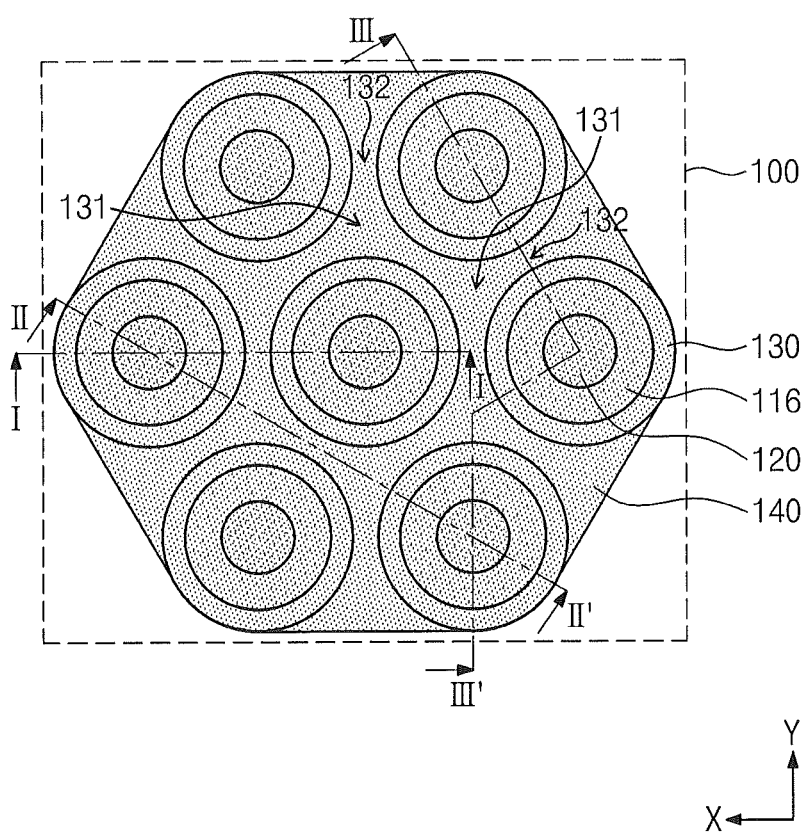
Figure 5B:
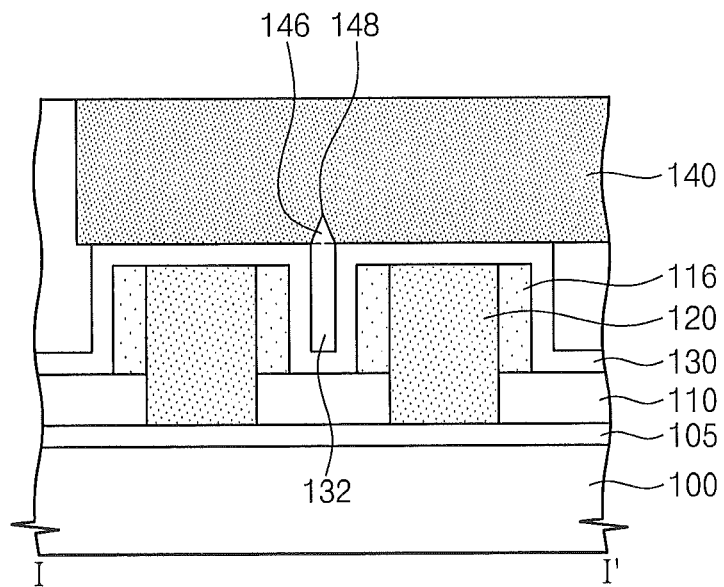
Figure 5C:
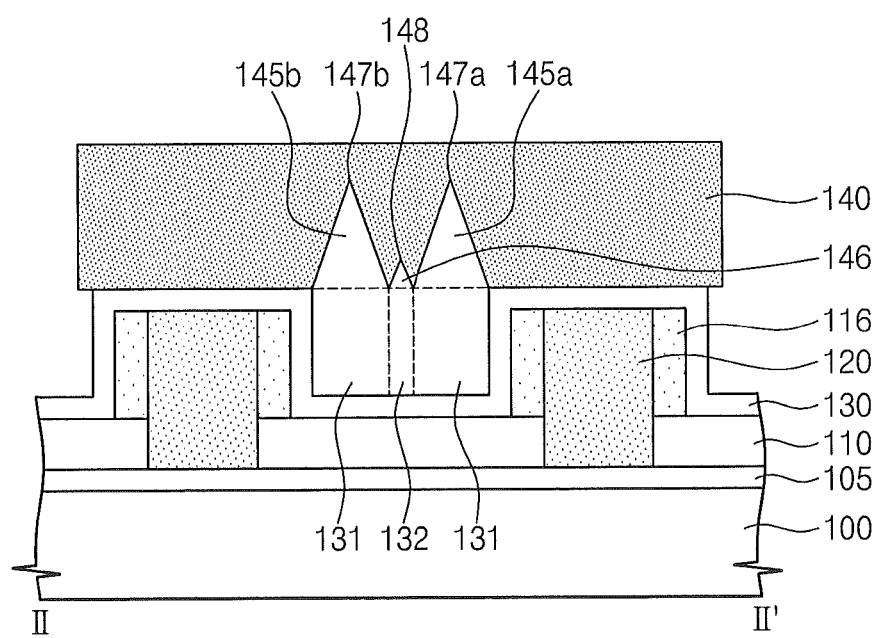

Referring to FIGS. 5A, 5B, and 5C, a sacrificial layer 140 may be formed on the etch-target layer 100 provided with the barrier layer 130. The sacrificial layer 140 may be formed to cover the entire surface of the etch-target layer 100 or cover a localized region of the etch-target layer 100 provided with the dielectric patterns 120 as shown in FIG. 5A. The sacrificial layer 140 may include a non-conformal material having low conformality or poor step coverage (e.g., PTEOS layer).

As the result of the use of the material having low conformality, first and second voids 145a/145b and 146 may be formed during the formation of the sacrificial layer 140. The first voids 145a and 145b may be formed on the first gap regions 131, and the second void 146 may be formed on the second gap region 132. Further, the first and second voids 145 and 146 may be formed to have an upward tapered shape.

The first and second voids 145 and 146 may be formed to have tops or tips positioned at different levels. For example, the top or tip 147a, 147b of the first voids 145a, 145b may be higher than the tip 148 of the second void 146. This difference in vertical position of the tops of the first and second void 145 and 146 may result from the difference in horizontal widths of the first and second gap regions 131 and 132. For example, the first voids 145a, 145b may have a tip 147a, 147b higher than the tip 148 of the second void 146, in the case where the first gap region 131 is formed to be wider than the second gap region 132. This will be described in more detail with reference to FIGS. 5D and 5E.

Figure 5D:
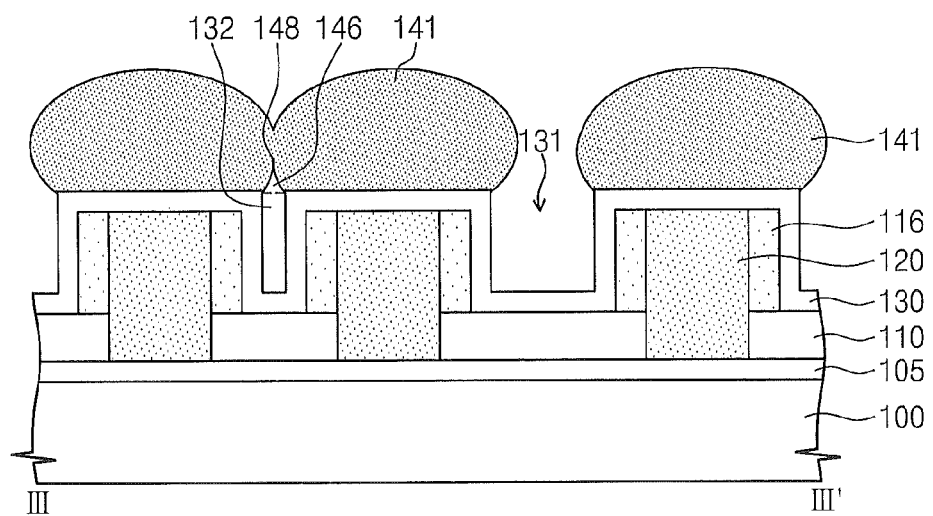
FIGS. 5D and 5E are sectional views taken along a line III-III' of FIG. 5A.
Figure 5E:
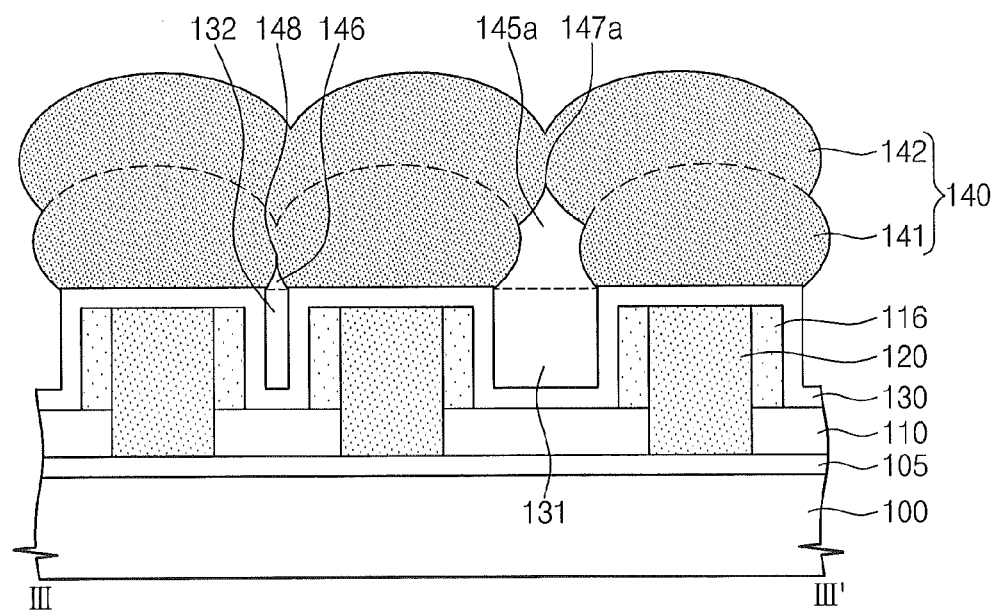

FIGS. 5D and 5E are sectional views taken along a line of FIG. 5A to illustrate how the sacrificial layer 140 is formed. In example embodiments, the sacrificial layer 140 may include a first sacrificial layer 141 and a second sacrificial layer 142, which may be sequentially formed, as shown in FIGS. 5D and 5E.

Referring to FIG. 5D, the first sacrificial layer 141 may be formed on the etch-target layer 100. The first sacrificial layer 141 may be formed of a material having low conformality. Accordingly, the first sacrificial layer 141 may be formed on the dielectric patterns 120 and the first and second gap region 131 and 132 may not be completely filled with the first sacrificial layer 141. For example, since the second gap region 132 has a relatively small width, the first sacrificial layer 141 may be formed to have an over-hang portion on the second gap region 132, and thus, the second void 146 may be formed on the second gap region 132. By contrast, since the first gap region 131 has a width larger than that of the second gap region 132, the first gap region 131 may not be fully covered with the first sacrificial layer 141.

Referring to FIG. 5E, the second sacrificial layer 142 may be formed on the etch-target layer 100 to cover the first sacrificial layer 141. The second sacrificial layer 142 may be formed on the first sacrificial layer 141 to have an over-hang portion on the first gap region 131, and thus, the first void 145a may be formed on the first gap region 131. Since the first void 145a is delimited by the second sacrificial layer 142, it has a top 147a higher than the top 148 of the second void 146. In other words, the first and second voids 145 and 146 may be formed to have tops located at different levels.

In example embodiments, the first voids 145a, 145b may be connected to the first gap region 131, and the second void 146 may be connected to the second gap region 132. In other words, the first and second voids 145a/145b and 146 may be extensions of the first and second gap regions 131 and 132, respectively. Furthermore, as shown in FIG. 5C, the first and second gap regions 131 and 132 and the first and second voids 145 and 146 may be connected to each other along a direction II-II' of FIG. 5A.

FIGS. 1A-5E may also be regarded as illustrating the formation of a second layer 140 on a first layer 130 that is itself on a target layer 100. The second layer 140 spans a first hole 131 in the first layer 130. The second layer 140 includes a first tapered void 145a therein that extends from the first hole 131 and tapers to a first tip 147a in the second layer. These figures also illustrate that the second layer 140 spans a second hole 131 in the first layer 130 that is spaced apart from the first hole, and the second layer 140 further includes a second tapered void 145b therein that extends from the second hole 131 and tapers to a second tip 147b in the second layer 140. These figures also illustrate that the second layer 140 spans a third hole 132 in the first layer 130 that is between the first and second holes 131. The second layer 140 further includes a third tapered void 146 therein that extends from the third hole 132 to a third tip 148 in the second layer 140.

Figure 6A:
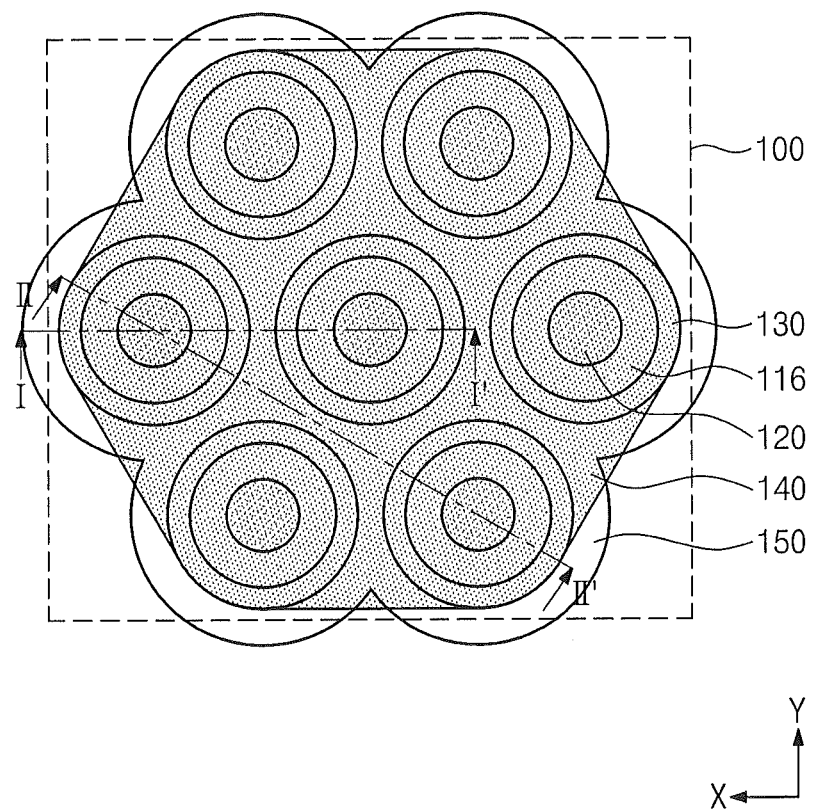
Figure 6B:
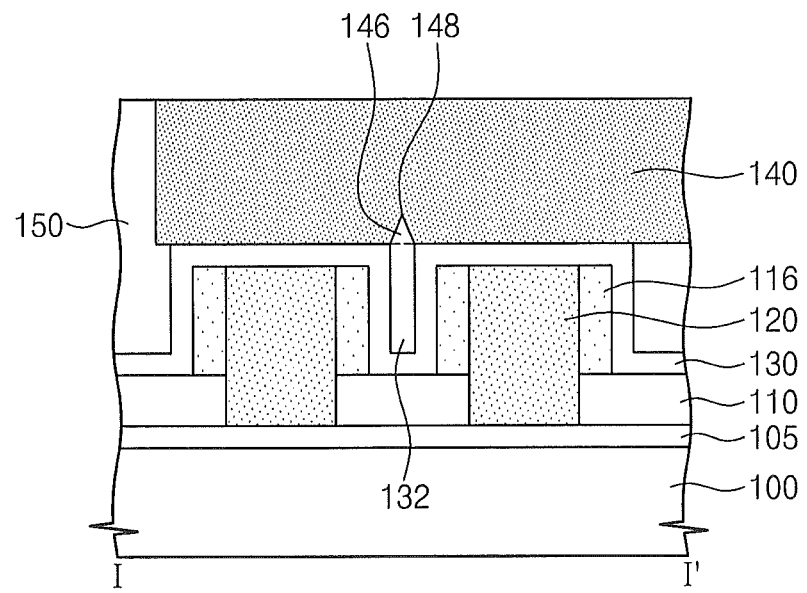
Figure 6C:
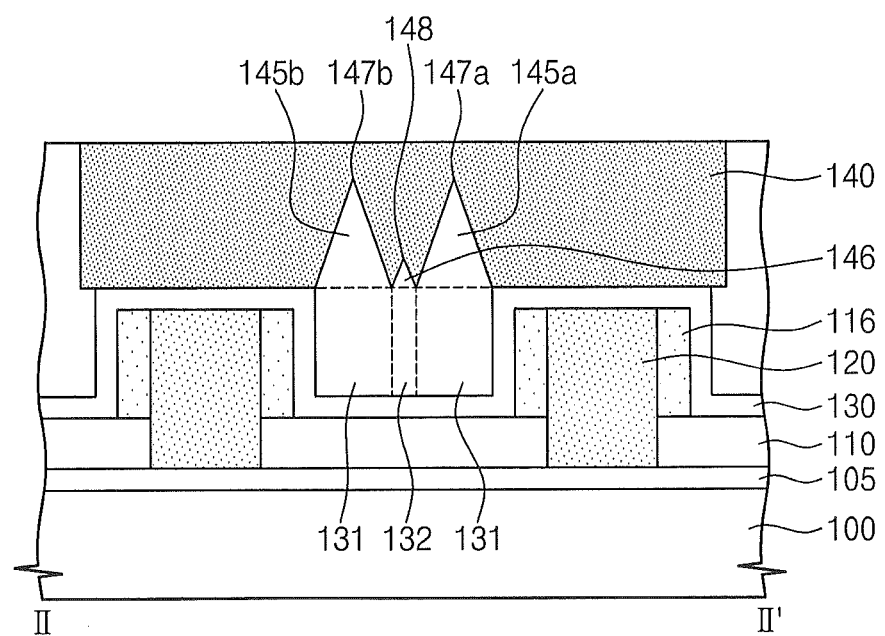

Referring to FIGS. 6A, 6B, and 6C, an interlayer dielectric 150 may be formed to cover an edge portion of the dielectric patterns 120. For example, in the case where the sacrificial layer 140 is formed at a localized region provided with the dielectric patterns 120, the interlayer dielectric 150 may be formed to fill a portion that is not occupied by the sacrificial layer 140. The interlayer dielectric 150 may include a material having a good step coverage property (e.g., a silicon oxide layer). In example embodiments, the interlayer dielectric 150 may serve as an etch stop layer, reducing or preventing the barrier layer 130 from being etched during a subsequent process of removing a portion of the sacrificial layer 140. Alternatively, the sacrificial layer 140 may be formed on the entire surface of the etch-target layer 100, and in this case, the formation of the interlayer dielectric 150 may be omitted.

Figure 7A:
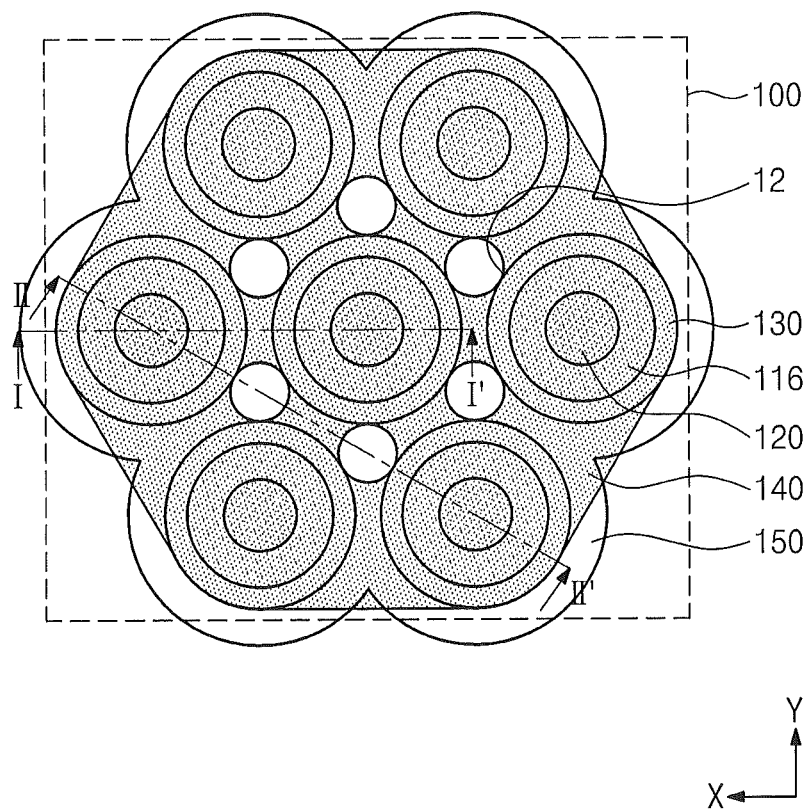
Figure 7B:
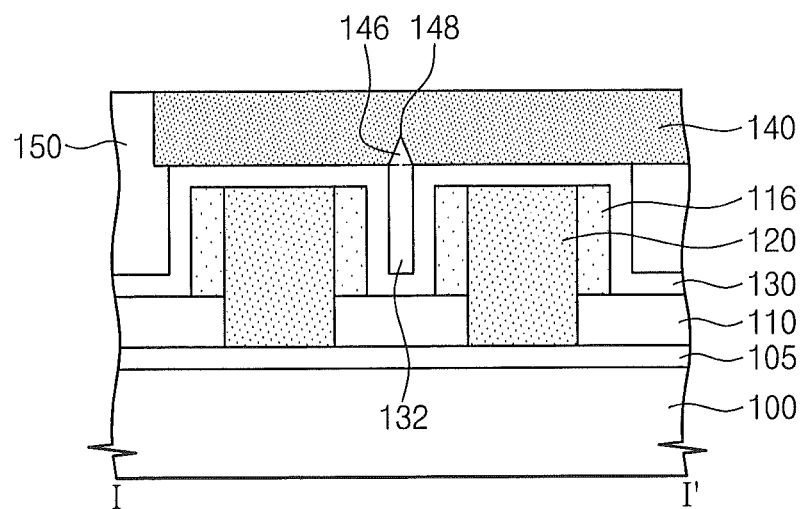
Figure 7C:
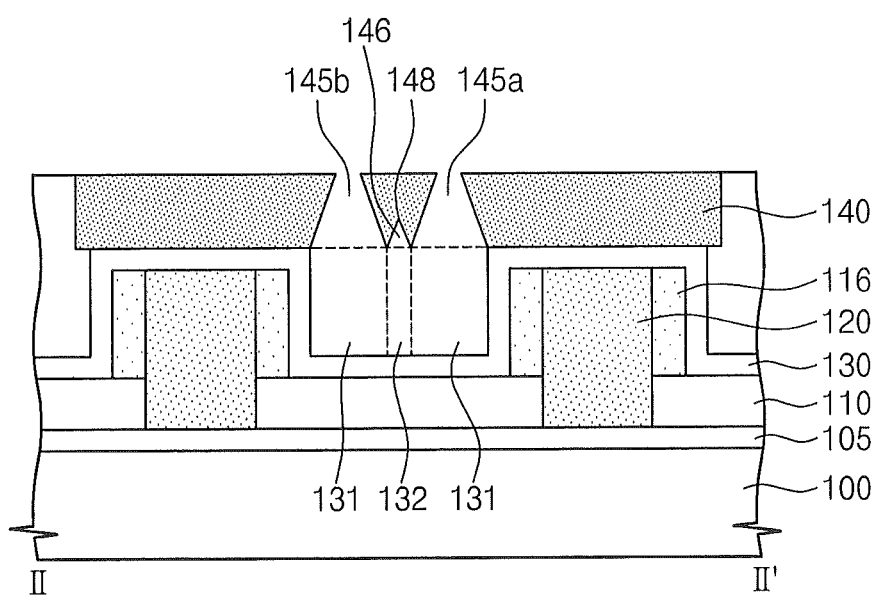

Referring to FIGS. 7A, 7B, and 7C, the sacrificial layer 140 may be partially removed to expose the first voids 145a/145b. The partial removal of the sacrificial layer 140 may include an etch-back process and/or a planarization process. The partial removal of the sacrificial layer 140 may be performed to expose the tops 147a, 147b of the first voids 145a, 145b but not to expose the top 148 of the second void 146. Since the first voids 145a, 145b have top surfaces 147a, 147b higher than that of the second void 146, the selective exposure of the first voids 145a, 145b can be achieved by controlling an etch depth of the partial removal of the sacrificial layer 140. Accordingly, as shown in FIG. 7C, the first voids 145a, 145b may be exposed and the second void 146 may be covered with the remaining portion of the sacrificial layer 140. Accordingly, FIGS. 7A, 7B and 7C illustrate exposing the first and second tips 147a, 147b in the second layer 140, without exposing the third tip 148 of the second layer 140.

Figure 8A:
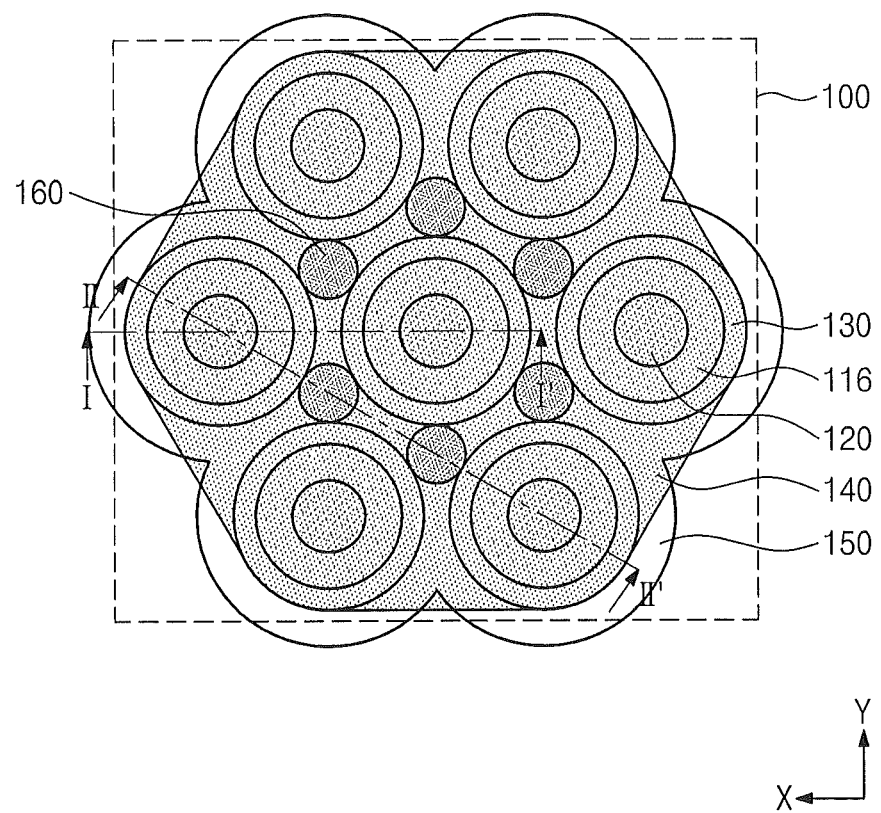
Figure 8B:
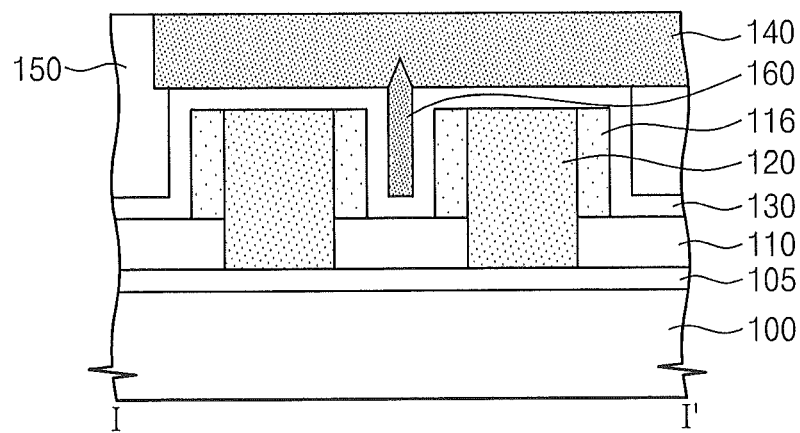
Figure 8C:
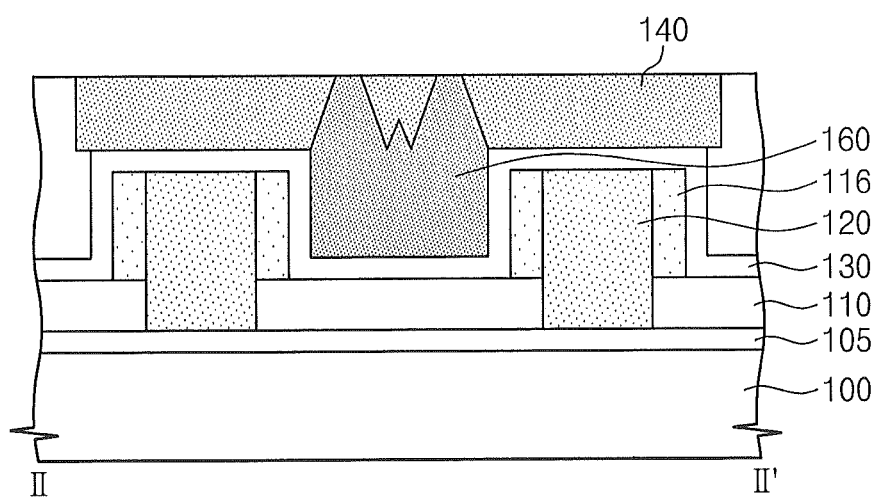

Referring to FIGS. 8A, 8B, and 8C, a gap-filling layer 160 may be formed to fill the first and second gap regions 131 and 132. For example, the formation of the gap-filling layer 160 may include depositing the gap-filling layer on the etch-target layer 100 and planarizing the gap-filling layer to expose the top surface of the sacrificial layer 140. The gap-filling layer 160 may fill the first and second gap regions 131 and 132 through the first voids 145a, 145b. In other words, since the first and second gap regions 131 and 132 may be connected to the first voids 145a, 145b, as shown in FIG. 8C, the first and second gap regions 131 and 132 may be filled with the gap-filling layer 160 that may be supplied through the open top entrance of the first voids 145a, 145b. Accordingly, the first and second voids 145a/145b and 146 connected to the first and second gap regions 131 and 132 may be also filled with the gap-filling layer 160. The gap-filling layer 160 may include a material having an etch selectivity with respect to the sacrificial layer 140 and the barrier layer 130. For example, the gap-filling layer 160 may include a polymeric material. In other example embodiments, the gap-filling layer 160 may include the same material as the first mask layer 110 (e.g., a polysilicon layer).

Figure 9A:
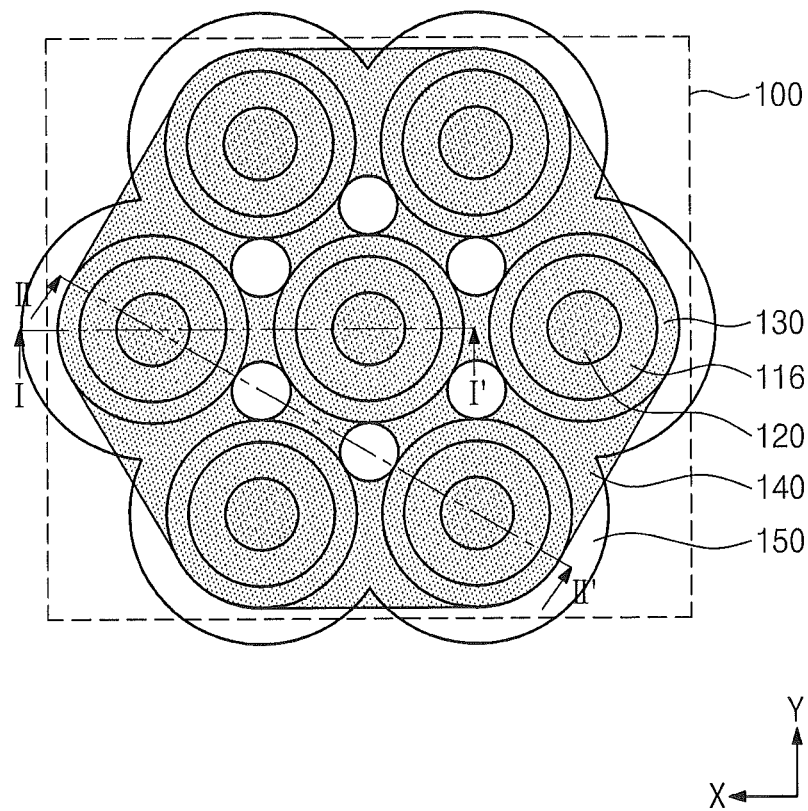
Figure 9B:
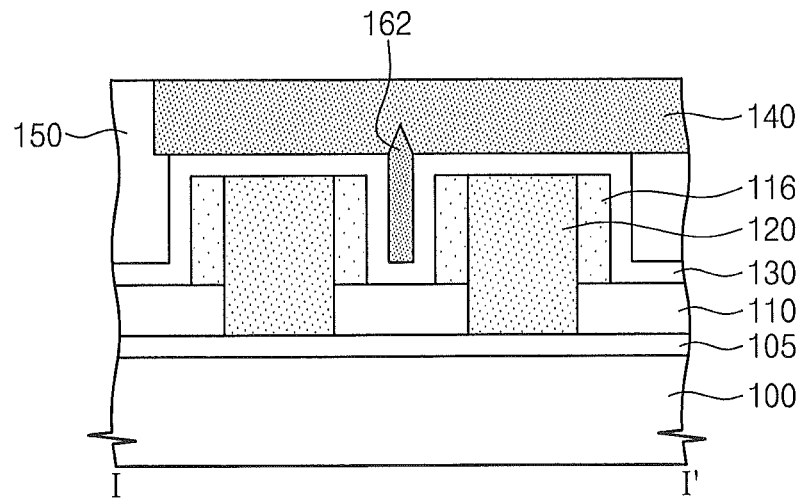
Figure 9C:
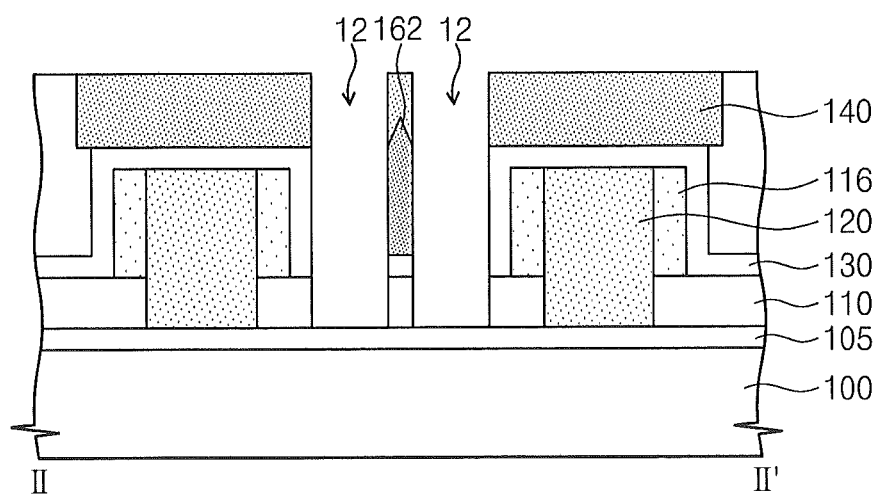

Referring to FIGS. 9A, 9B, and 9C, the gap-filling layer 160 may be selectively etched using the sacrificial layer 140 as an etch mask to form second holes 12. The formation of the second holes 12 may include anisotropically etching an exposed portion of the gap-filling layer 160. The anisotropic etching process may be performed until the first mask layer 110 or the etch-stop layer 105 is exposed. Accordingly, as shown in FIG. 9A, the second holes 12 may be formed in the first gap regions 131, and a portion of the gap-filling layer may remain in the second gap region 132 to form a gap-filling pattern 162. In other words, as shown in FIGS. 9B and 9C, as the result of the anisotropic etching process, the gap-filling layer 160 filling the second gap region 132 and the second void 146 may not be removed and remain as the gap-filling pattern 162. In the case where the gap-filling pattern 162 is formed between adjacent two of the dielectric patterns 120, it may be used to support the second holes 12. In other example embodiments, the formation of the gap-filling layer 160 described with reference to FIG. 8 may be omitted. In this case, the anisotropic etching process using the sacrificial layer 140 as an etch mask may be performed to form directly the second holes 12 in the first voids 145.

Figure 10A:
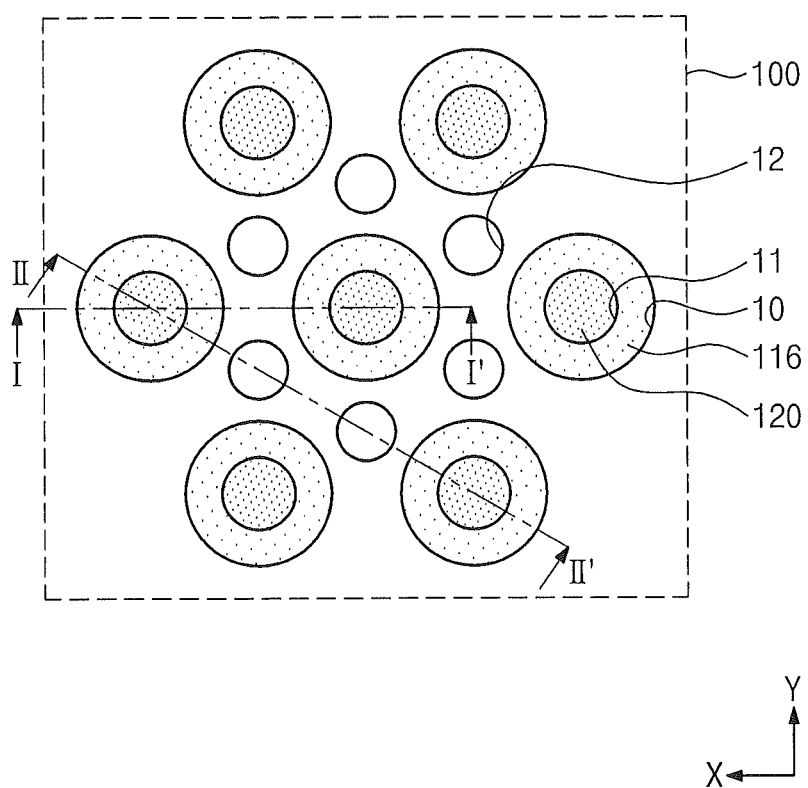
Figure 10B:
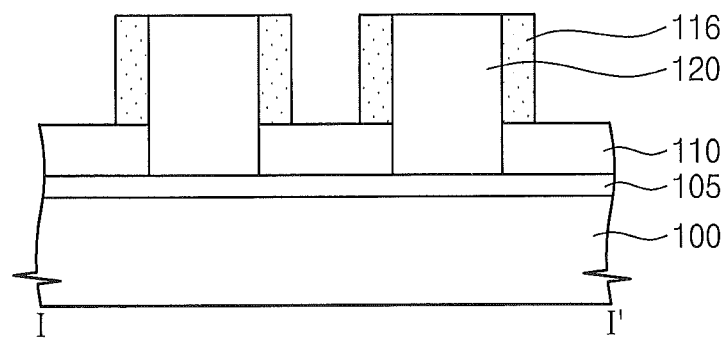
Figure 10C:
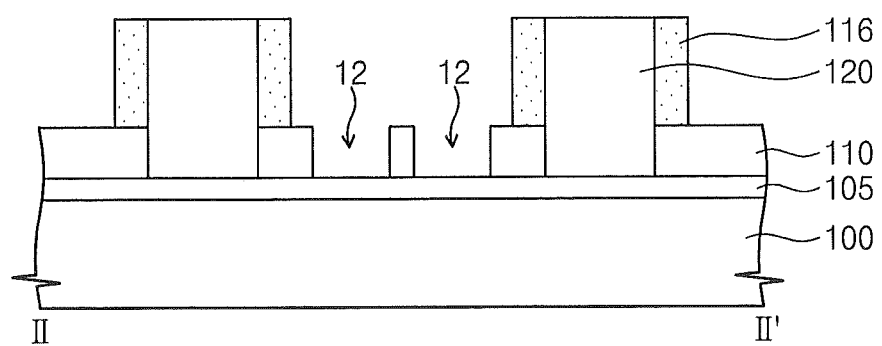

Referring to FIGS. 10A, 10B, and 10C, the interlayer dielectric 150, the sacrificial layer 140, and the barrier layer 130 may be selectively removed using, for example, a dry or wet etching process or an ashing process. In example embodiments, the interlayer dielectric 150, the sacrificial layer 140, and the barrier layer 130 may be sequentially or simultaneously removed. During the removal of the interlayer dielectric 150, the sacrificial layer 140, and the barrier layer 130, the etch-stop layer 105 may not be removed to remain on the etch-target layer 100, and thus, the etch-stop layer 105 may be used to protect the etch-target layer 100.

Figure 11A:
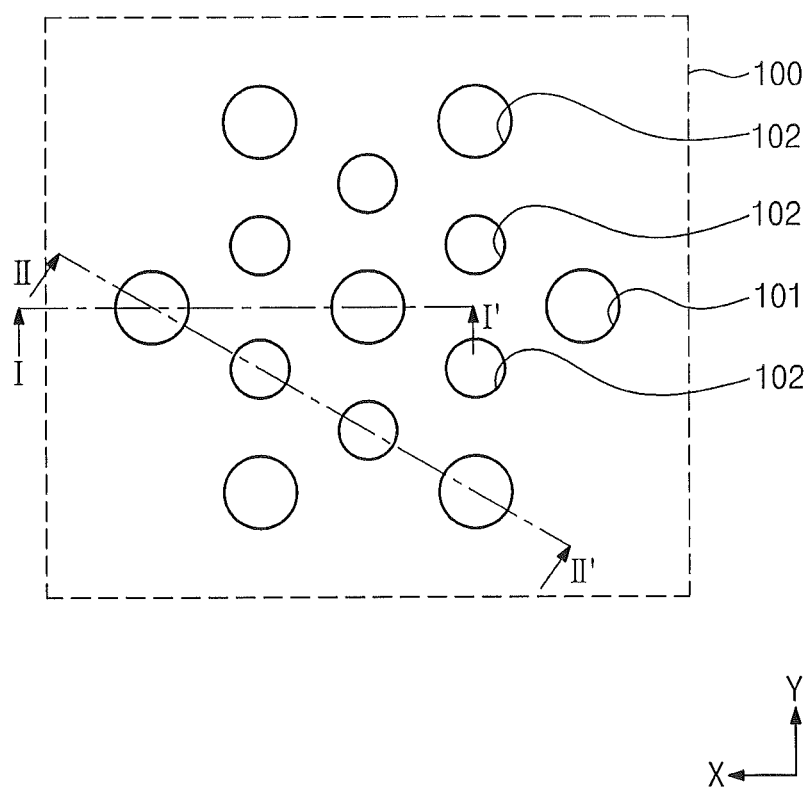
Figure 11B:
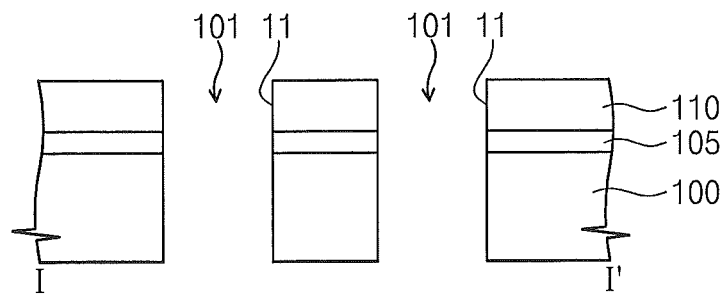
Figure 11C:
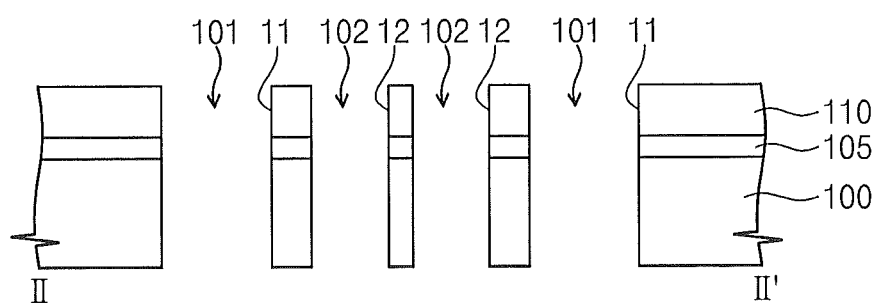

Referring to FIGS. 11A, 11B, and 11C, the dielectric patterns 120 and the spacers 116 may be selectively removed to form the first holes 11 and the second holes 12 exposing the etch-stop layer 105. Thereafter, the etch-target layer 100 may be anisotropically etched to form a first contact hole 101 and a second contact hole 102 that are located below the first and second holes 11 and 12, respectively. The first contact hole 101 may be a region formed by etching the etch-stop layer 105 exposed by the first holes 11, and then, etching the etch-target layer 100. Similarly, the second contact holes 102 may be a region formed by etching the etch-stop layer 105 exposed by the second holes 12, and then, etching the etch-target layer 100. In the etching process, the first mask layer 110 may be used as an etch mask. Accordingly, FIGS. 8A-10C illustrate forming a hole in the target layer 100 using the first and second tips 147a, 147b in the second layer 140 that were exposed in FIGS. 7A-7C.

According to example embodiments of the inventive concepts, it is possible to form additionally the second contact holes 102 that have spaces less than those of the first contact holes 101, in addition to the first contact holes 101 formed using a selective etching process. Thus, a device according to example embodiments of the inventive concepts can be formed to have an increased integration density.

The afore-described process of forming the first and second contact holes 101 and 102 may be, for example, applied to fabricate a semiconductor memory device. A conductive layer and/or a dielectric layer may be formed in the first and second contact holes 101 and 102 to realize a contact plug, a capacitor, and so forth.

FIGS. 12A through 15A are plan views illustrating a method of fabricating a semiconductor device according to other example embodiments of the inventive concepts. FIGS. 12B through 15B are sectional views taken along lines I-I' of FIGS. 12A through 15A, and FIGS. 12C through 15C are sectional views taken along lines II-II' of FIGS. 12A through 15A, respectively. For the sake of brevity, the elements and features of this example that are similar to those previously shown and described will not be described in much further detail.

Figure 12A:
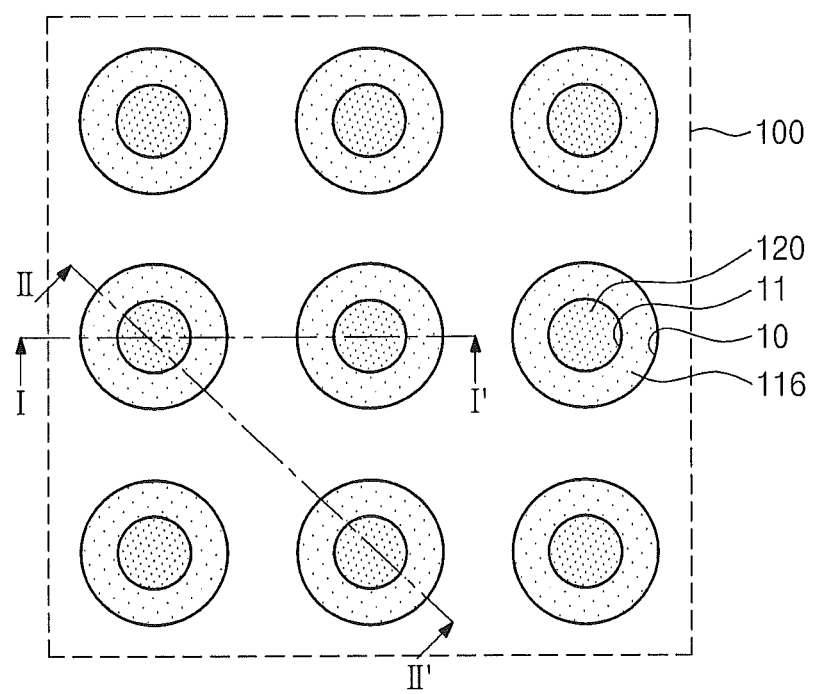
Figure 12B:
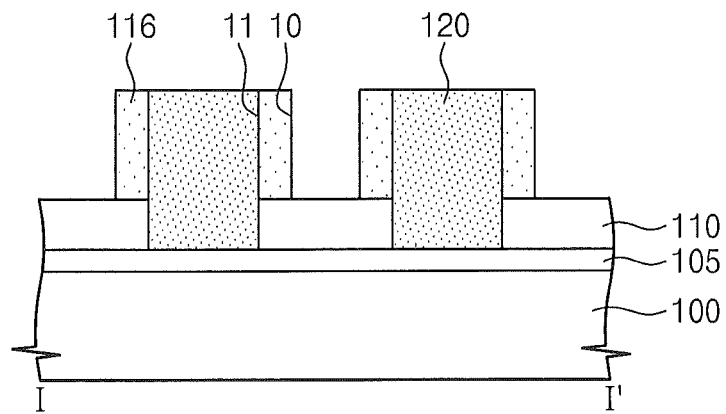
Figure 12C:
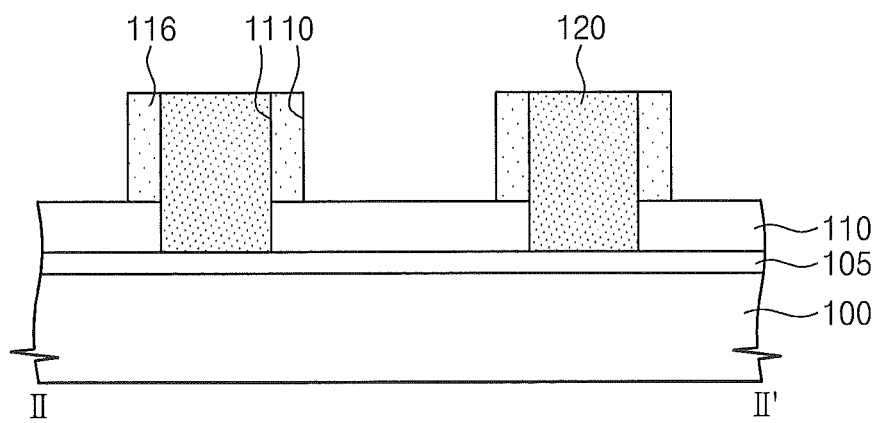

Referring to FIGS. 12A, 12B, and 12C, the dielectric patterns 120 may be formed on the etch-target layer 100 to fill the first holes 11. The dielectric patterns 120 may be arranged to form a plurality of rows, each of which is parallel to a first direction, and form a plurality of columns, each of which is parallel to a second direction perpendicular to the first direction. For example, unlike the previous embodiments of the inventive concepts, the dielectric patterns 120 in the present embodiment may be regularly arranged in both of the first and second directions to form a lattice- or matrix-shaped arrangement. The formation of the first holes 11 may include forming the first preliminary holes 10 on the etch-target layer 100 and forming the spacers 116 on the inner sidewalls of the first preliminary holes 10, respectively, as described with reference to FIGS. 1A through 11A.

Figure 13A:
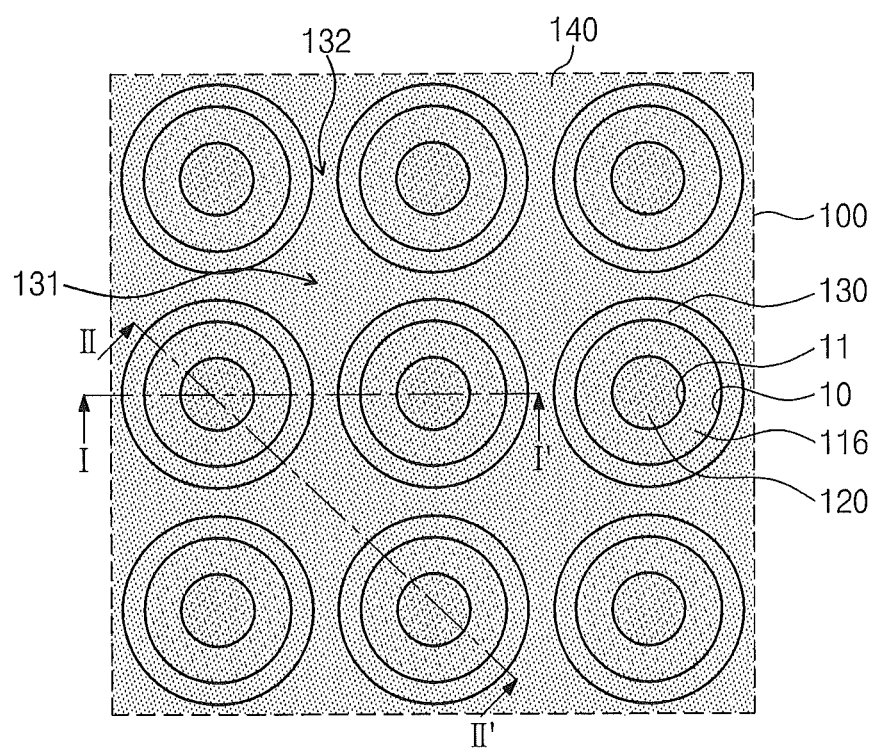
Figure 13B:
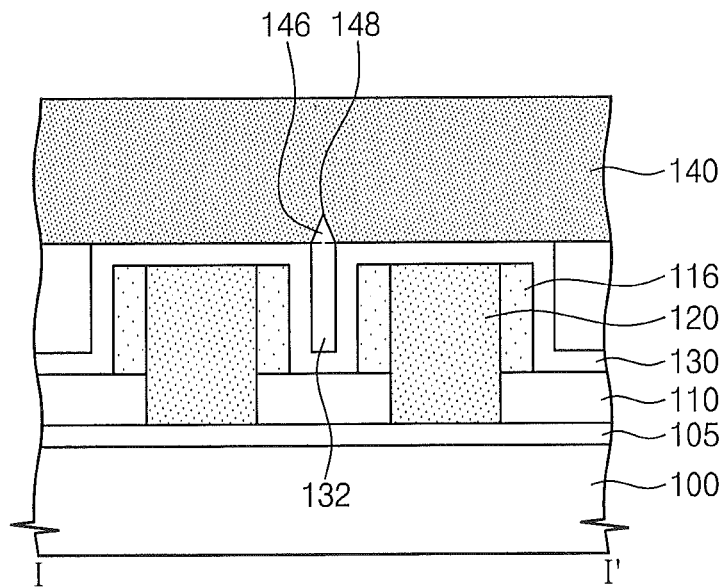
Figure 13C:
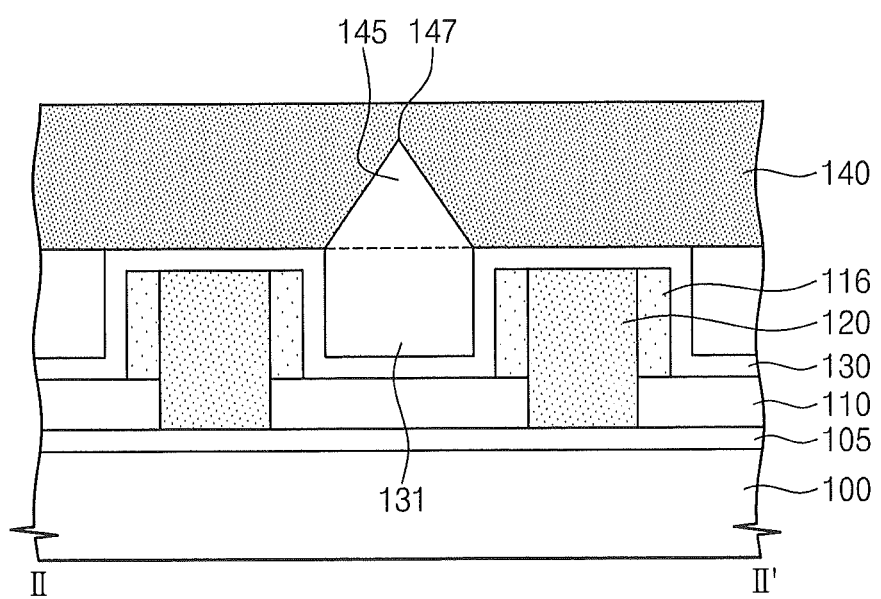

Referring to FIGS. 13A, 13B, and 13C, the barrier layer 130 may be conformally formed on the dielectric patterns 120, and the sacrificial layer 140 may be formed on the resulting structure. The sacrificial layer 140 may be formed using a material having a low conformality, and thus, the first and second voids 145 and 146 may be formed in the sacrificial layer 140. In the present embodiment, since the dielectric patterns 120 are arranged to form the matrix-shaped arrangement, the first gap region 131 may be defined by four of the dielectric patterns 120 disposed adjacent to each other. Further, similar to that of described with reference to FIGS. 1A through 11A, the second gap region 132 may be defined by two of the dielectric patterns 120 disposed adjacent to each other. The first void 145 may be formed on the first gap region 131, and the second void 146 may be formed on the second gap region 132. The first gap region 131 may be formed to have a greater width than that of the second gap region 132, and thus, the first void 145 may be formed to have a top 147 located at a higher level than the top 148 of the second void 146.

Figure 14A:
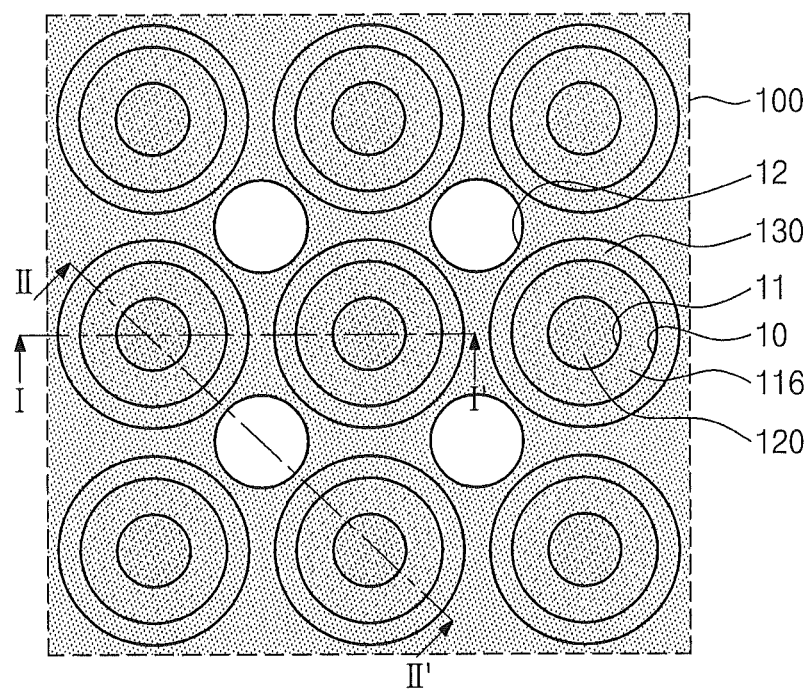
Figure 14B:
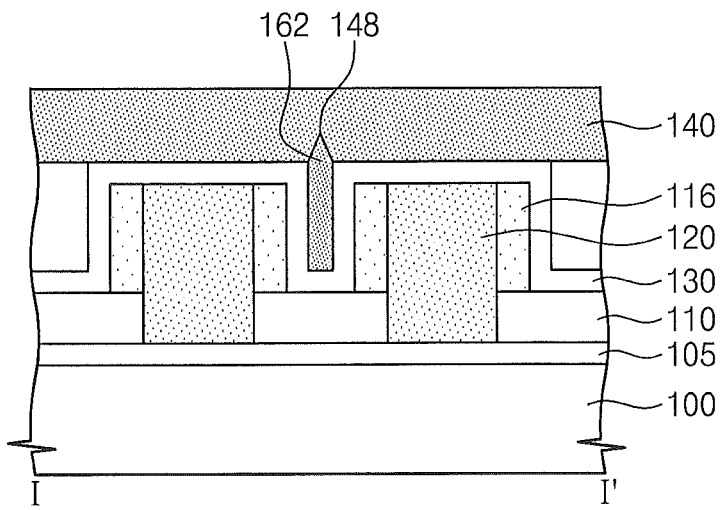
Figure 14C:
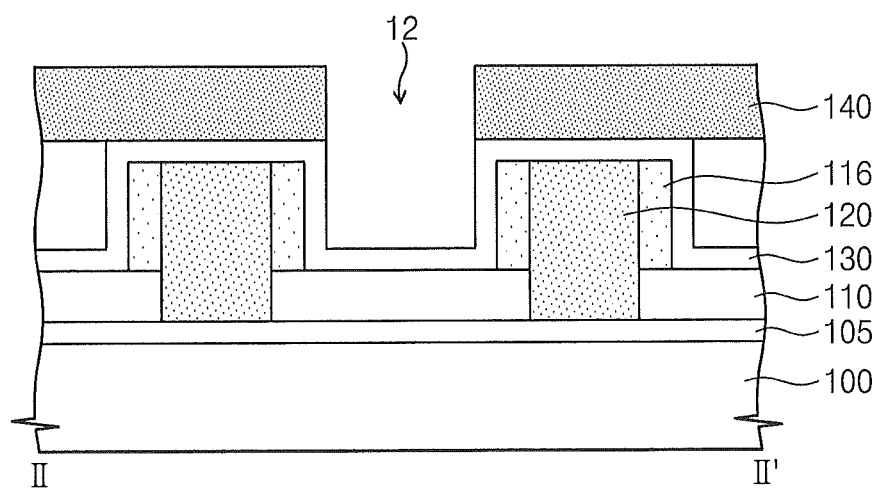

Referring to FIGS. 14A, 14B, and 14C, similar to that of described with reference to FIGS. 1A through 11A, the sacrificial layer 140 may be partially removed to expose the first void 145. The partial removal of the sacrificial layer 140 may be performed to expose the top 147 of the first void 145 but not to expose the top 148 of the second void 146. Thereafter, the gap-filling layer may be formed to fill the first and second gap regions 131 and 132 through the first void 145, and then, the gap-filling layer may be anisotropically etched to form the second holes 12. As the result of the use of the anisotropic etching, the gap-filling layer may not be removed from the second gap region 132 and the second void 146 to form the gap-filling pattern 162. Accordingly, the second holes 12 may be formed at positions of the first gap regions 131, and the second gap region 132 may be filled with the gap-filling pattern 162 supporting and delimiting the second holes 12.

Figure 15A:
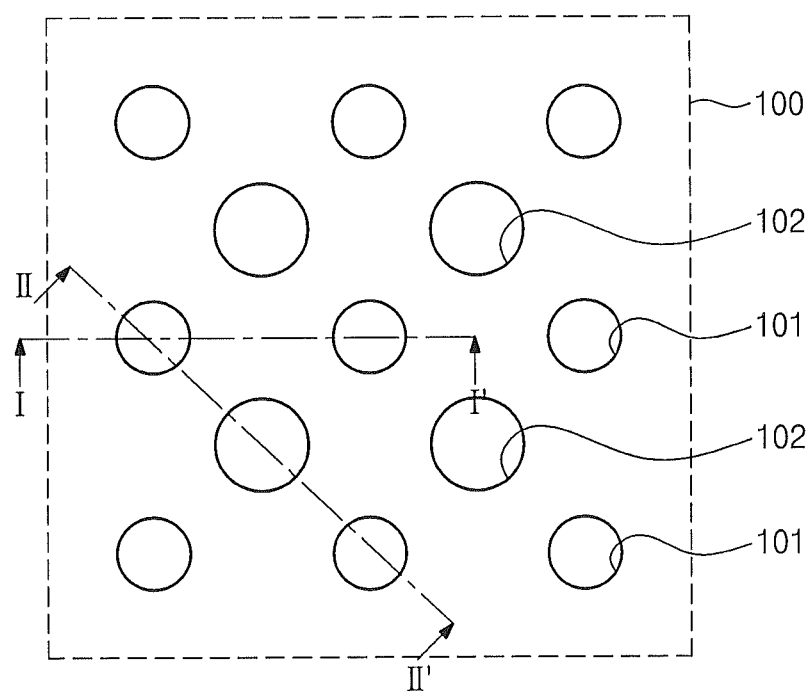
Figure 15B:
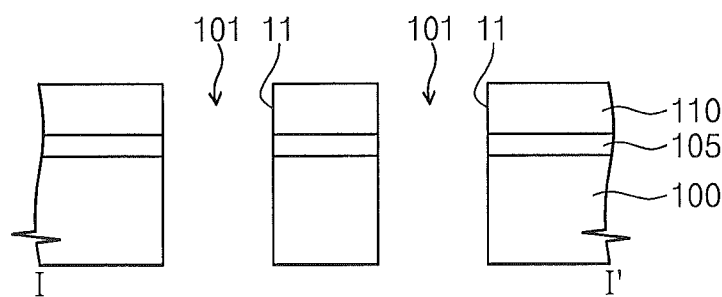
Figure 15C:
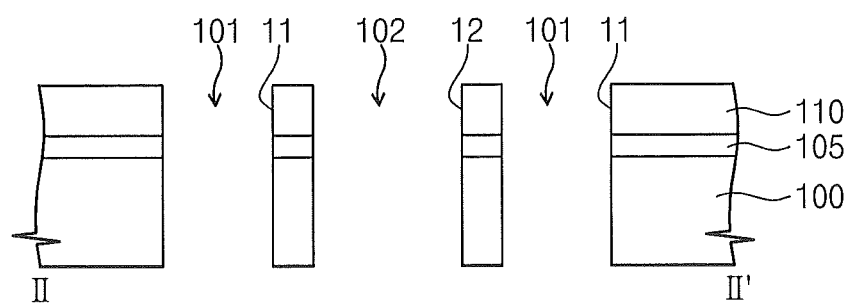

Referring to FIGS. 15A, 15B, and 15C, the sacrificial layer 140, the barrier layer 130, the dielectric patterns 120, and the spacers 116 may be selectively removed to form the first and second holes 11 and 12, and thereafter, the first and second contact holes 101 and 102 may be formed through the etch-target layer 100. According to the present embodiment, the first and second contact holes 101 and 102 may be formed to have a zigzag arrangement, and the second contact holes 102 may be additionally formed to have spaces less than those of the first contact holes 101, in addition to the first contact holes 101 formed using a selective etching process. Thus, a device according to the present embodiment can be formed to have an increased integration density.

The semiconductor memory devices according to embodiments described above may be encapsulated using various packaging techniques. For example, the semiconductor memory devices according to the aforementioned embodiments may be encapsulated using a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and/or a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 16:
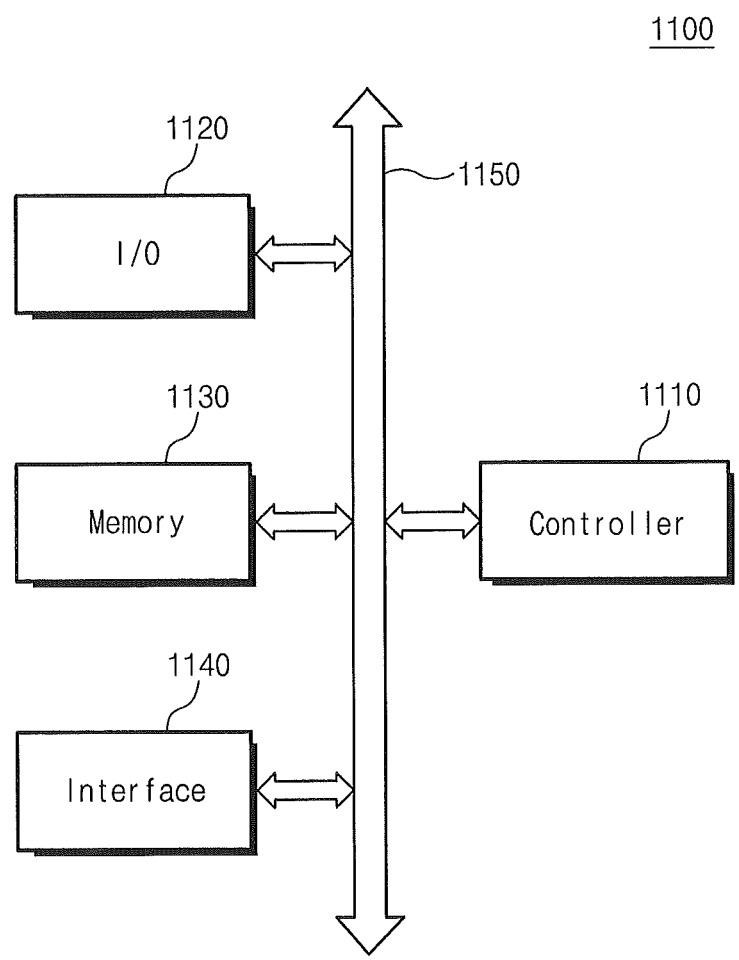
FIG. 16 is a schematic block diagram illustrating an example of an electronic system including semiconductor memory devices according to example embodiments of the inventive concepts.

FIG. 16 is a schematic block diagram illustrating an example of an electronic system including semiconductor memory devices according to embodiments of the inventive concepts.

Referring to FIG. 16, an electronic system 1100 according to an embodiment of the inventive concepts may include a controller 1110, an input/output (I/O) unit 1120, a memory device 1130a, an interface unit 1140, and a data bus 1150. At least two of the controller 1110, the I/O unit 1120, the memory device 1130a, and the interface unit 1140 may communicate with each other through the data bus 1150. The data bus 1150 may correspond to a path through which electrical signals are transmitted.

The controller 1110 may include, e.g., at least one of a microprocessor, a digital signal processor, a microcontroller, or another logic device. The other logic device may have a similar function to any one of the microprocessor, the digital signal processor, and the microcontroller. The I/O unit 1120 may include, e.g., a keypad, a keyboard, and/or a display unit. The memory device 1130a may store data and/or commands. The memory device 1130a and/or any of the blocks of FIG. 16 may include at least one of the semiconductor memory devices according to the embodiments described above. The memory device 1130a and/or any of the other blocks of FIG. 16 may further include other type of semiconductor memory devices which are different from the semiconductor devices described above. For example, the memory device 1130 and/or any of the other blocks of FIG. 16 may further include a non-volatile memory device (e.g., a flash memory device, a magnetic memory device, a phase change memory device, etc) and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to, e.g., a personal digital assistant (PDA), a portable computer, a web tablet, a wireless phone, a mobile phone, a digital music player, a memory card and/or other electronic products. The other electronic products may receive or transmit information data by wireless.

Figure 17:
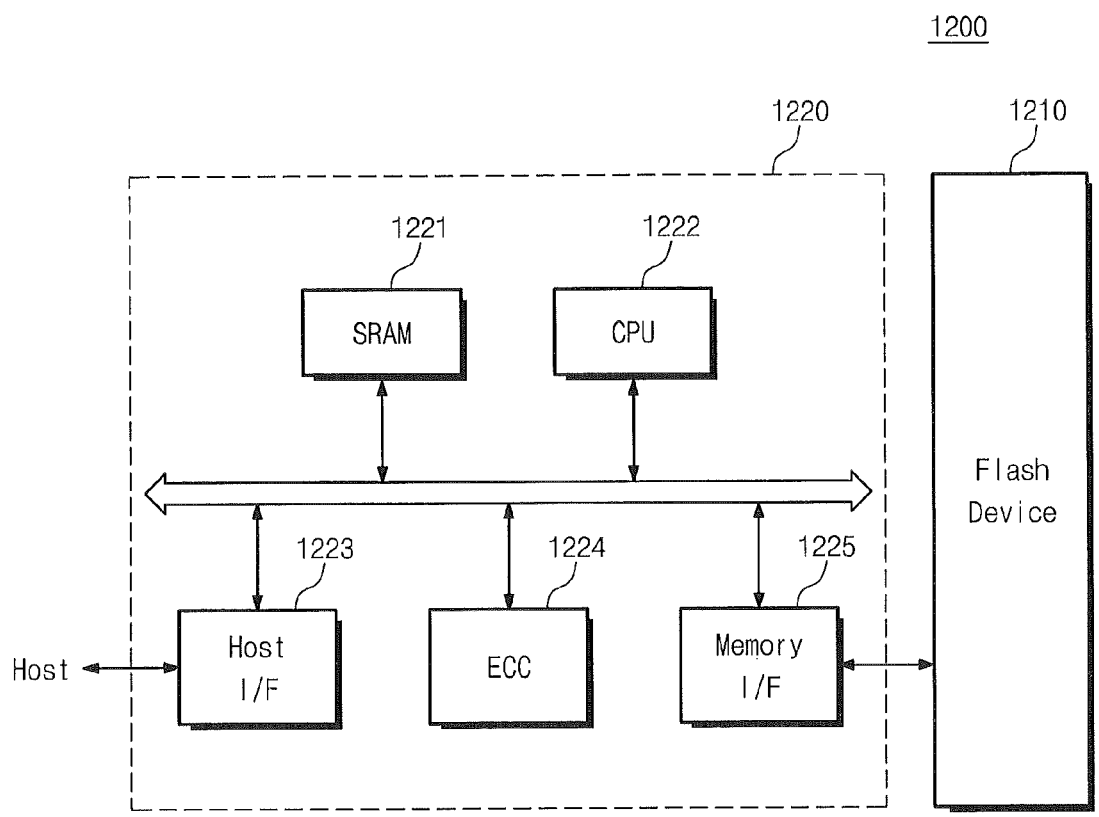
FIG. 17 is a schematic block diagram illustrating an example of a memory card including semiconductor memory devices according to example embodiments of the inventive concepts.

FIG. 17 is a schematic block diagram illustrating an example of a memory card including semiconductor memory devices according to embodiments of the inventive concepts.

Referring to FIG. 17, a memory card 1200 according to an embodiment of the inventive concepts may include a memory device 1210. The memory device 1210 and/or any of the other blocks of FIG. 17 may include at least one of the semiconductor memory devices according to the embodiments mentioned above. In other embodiments, the memory device 1210 and/or any of the other blocks of FIG. 17 may further include other types of semiconductor memory devices which are different from the semiconductor devices according to the embodiments described above. For example, the memory device 1210 and/or any of the other blocks of FIG. 17 may further include a non-volatile memory device (e.g., a flash memory device, a magnetic memory device, a phase change memory device, etc) and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include a SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

According to example embodiments of the inventive concepts, it is possible to form additionally the second contact holes that have spaces less than those of the first contact holes, in addition to the first contact holes formed using a selective etching process. Thus, a device according to example embodiments of the inventive concepts can be formed to have an increased integration density. The second contact holes may be formed of a sacrificial layer having a low conformality, and thus, a void may be formed at a gap region, in which the second contact holes will be formed. Thereafter, the second contact holes can be formed by exposing the void. According to this process, it is possible to simplify a process to form the contact holes and to control positions and sizes of the second contact holes.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device comprising:
    forming a second layer on a first layer that is itself on a target layer, the second layer spanning a first hole in the first layer and a second hole in the first layer that is spaced apart from the first hole, the second layer including a first tapered void therein that extends from the first hole and tapers to a first tip in the second layer, the second layer further including a second tapered void therein that extends from the second hole and tapers to a second tip in the second layer;
    exposing the first and second tips in the second layer; and
    forming a hole in the target layer using the first and second tips in the second layer that were exposed.

2. The method of claim 1 wherein the second layer further spans a third hole in the first layer that is between the first and second holes, the second layer further including a third tapered void therein that extends from the third hole to a third tip in the second layer; and
    wherein exposing the tip comprises exposing the first and second tips in the second layer without exposing the third tip in the second layer.

3. The method of claim 2 wherein the first and second holes are wider than the third hole.

* * * * *